(12) United States Patent
Jain

(10) Patent No.: US 6,469,924 B2
(45) Date of Patent: Oct. 22, 2002

(54) MEMORY ARCHITECTURE WITH REFRESH AND SENSE AMPLIFIERS

(75) Inventor: Raj Kumar Jain, Singapore (SG)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/855,147

(22) Filed: May 14, 2001

(65) Prior Publication Data

US 2002/0006050 A1 Jan. 17, 2002

Related U.S. Application Data

(63) Continuation-in-part of application No. 09/615,987, filed on Jul. 14, 2000, now Pat. No. 6,304,478.

(51) Int. Cl.⁷ ............................................. G11C 11/40
(52) U.S. Cl. .................... 365/154; 365/189.04; 365/222
(58) Field of Search ........................... 365/154, 189.04, 365/222, 155, 156

(56) References Cited

U.S. PATENT DOCUMENTS

| | | | | |
|---|---|---|---|---|
| 4,768,172 A | * | 8/1988 | Sasaki | 365/154 |
| 5,040,146 A | * | 8/1991 | Mattausch et al. | 365/154 |
| 6,118,689 A | * | 9/2000 | Kuo et al. | 365/154 |

\* cited by examiner

*Primary Examiner*—Tan T. Nguyen
(74) *Attorney, Agent, or Firm*—Stanton Braden

(57) ABSTRACT

An improved memory architecture is described. The memory architecture includes separately controlled refresh and sense amplifiers to enable a memory access and refresh cycle simultaneously.

1 Claim, 7 Drawing Sheets

US 6,469,924 B2

MEMORY ARCHITECTURE WITH REFRESH AND SENSE AMPLIFIERS

This is a continuation-in-part of patent applications, titled: "Single-Port Memory Cell", U.S. Ser. No. 09/806,395 and "Layout for a SemiConductor Memory", U.S. Ser. No. 09/615,987 now U.S. Pat. No. 6,304,478.

FIELD OF THE INVENTION

The present invention relates generally to memory architectures. More particularly, the invention relates to memory architecture with separate refresh and sense amplifiers.

BACKGROUND OF THE INVENTION

Integrated circuits (ICs) such as digital signal processors (DSPs) include on-chip memory for storage of information. The on-chip memory typically comprises, for example, an array of static random access memory (SRAM) cells connected by word lines in one direction and bit lines in another direction. The information stored in the SRAM cells are maintained until power is removed from the IC. Sense amplifiers are coupled to the bit lines to facilitate memory accesses, such as reads or writes. A sense amplifier is coupled to a pair of bit lines and senses a differential voltage indicative of the information stored in the selected memory cell on the bit line pair.

FIG. 1 shows a conventional SRAM cell 101. The SRAM cell comprises first and second transistors 110 and 120 coupled to a latch 130, which stores a bit of information. One transistor is coupled to a bit line 140 and the other is coupled to a bit line complement 141 while the gates are coupled to a word line 135. The latch includes first and second inverters 133 and 134, each implemented with two transistors. As such, the SRAM cell is realized using six transistors.

Smaller SRAM cells using less than six transistors have been proposed to reduce chip size. However, the charge stored in such cells dissipates overtime. In order to restore the information stored in the cell, a refresh operation is required. Typically, memory cells are refreshed one row at a time (e.g., one word line at a time). However, conventional SRAM architectures are unable to perform a refresh operation and a memory access simultaneously. As a result, a processor, if it wants to initiate a memory access while a refresh is being performed, must wait for the completion of the refresh.

As evidenced from the above discussion, it is desirable to provide a memory architecture wherein memory cells can be accessed during a refresh to improve performance.

SUMMARY OF THE INVENTION

The invention relates to memory architecture. In one embodiment, the memory architecture comprises separately controlled refresh and sense amplifiers to allow access to memory cells during a refresh operation.

PREFERRED EMBODIMENTS OF THE INVENTION

Figure 1:
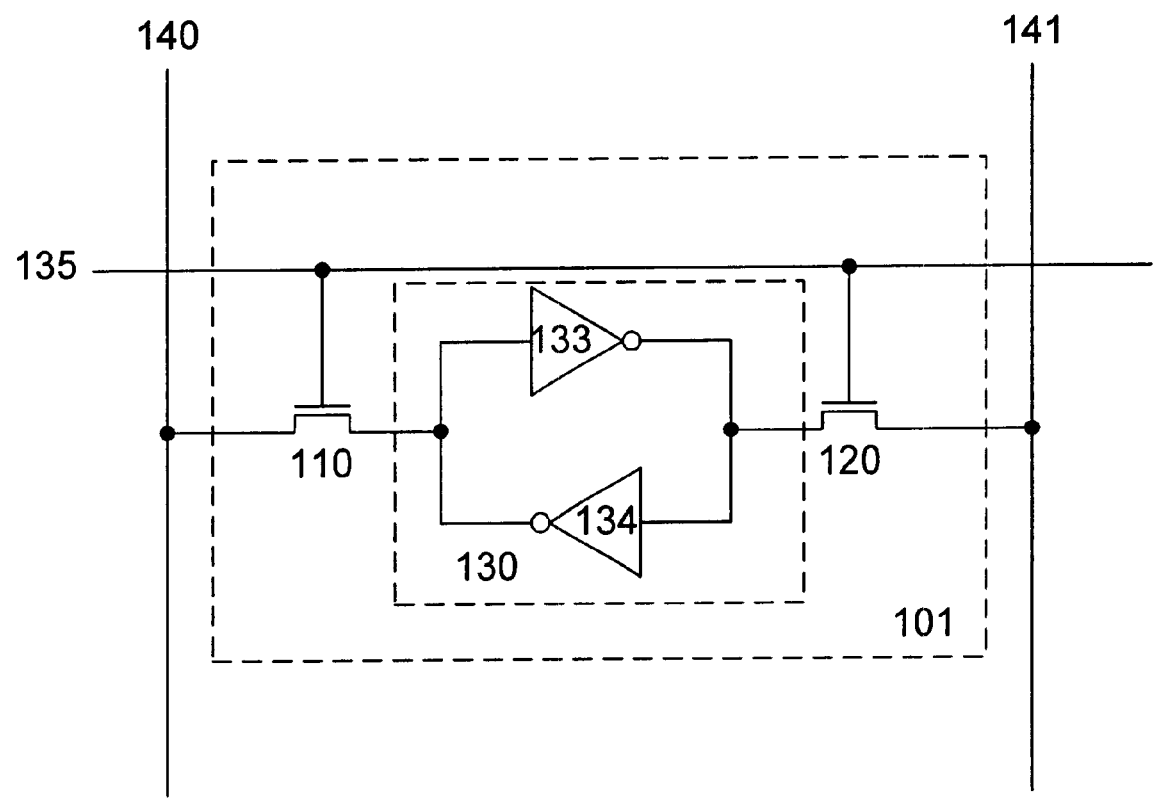
FIG. 1 shows a conventional SRAM cell.
Figure 2:
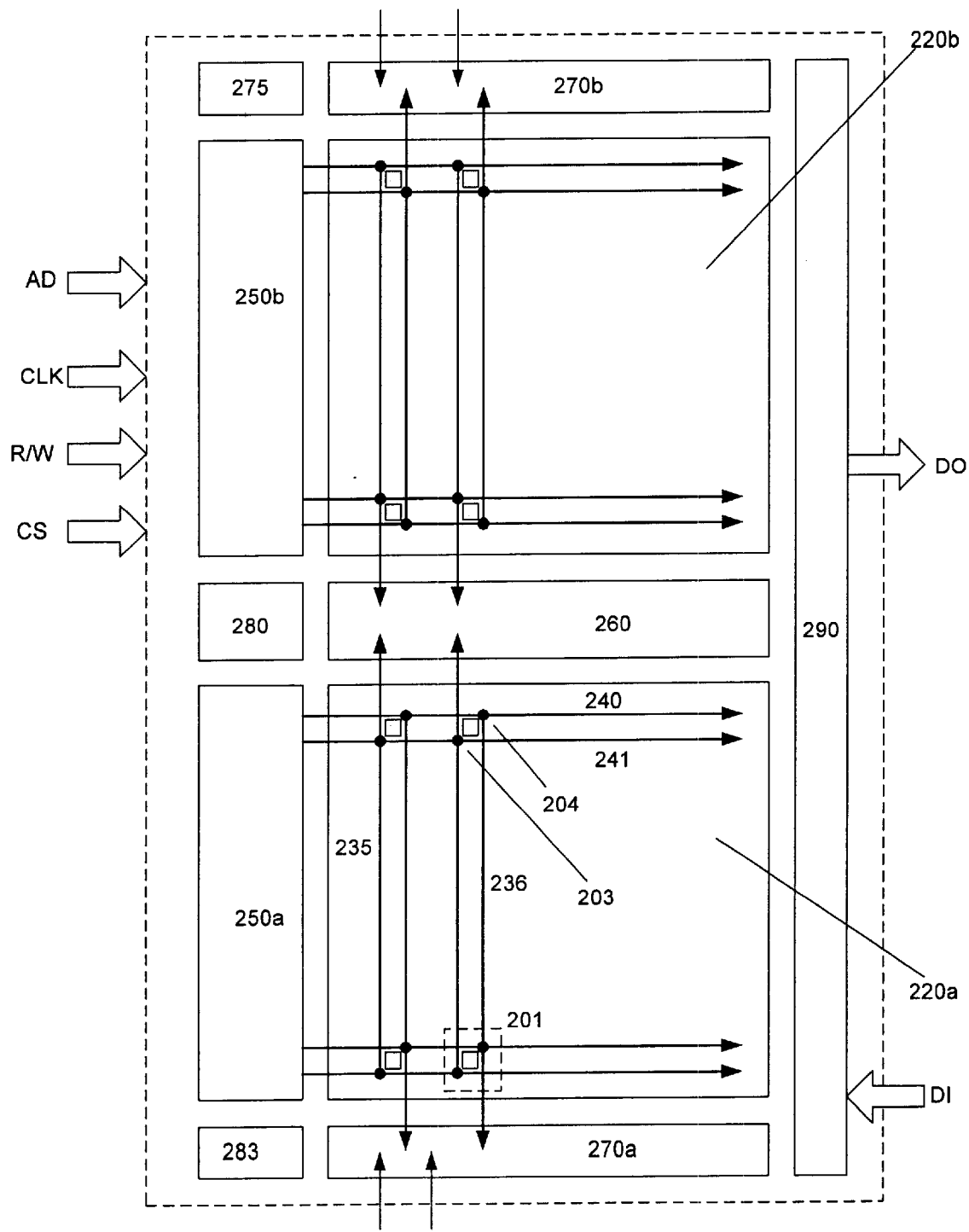
FIGS. 2–3 show memory architectures in accordance with various embodiments of the invention.

FIG. 2 shows a memory architecture or block 200 in accordance with one embodiment of the invention. Various input signals are provided to the memory block to control its operation. These input signals comprise, for example, select (SEL), address (AD), read/write (R/W), clock (CLK), and data-in (DI). The SEL signal selects the memory block for accessing while the R/W signal indicates the type of access (read or write). The AD provides the location or address of the memory access. The AD, for example, comprises row (RA) and column (CA) portions. The CLK signal provides the timing of the memory access for synchronous memories. If the memory access is a write, write data is provided on DI. If the memory access is a read, data read from memory is placed on DO.

In one embodiment, the memory block comprises a memory bank 210 with first and second sub-arrays 220a–b. It is also useful to provide a memory block having more than one memory bank as well as implementing a memory bank with different number of sub-arrays (e.g., 1, or 4). The sub-arrays include memory cells 201, wherein a memory cell comprises an access port 203 and a refresh port 204. Bit lines 235 and refresh bit lines 236 interconnect the memory cells in a first direction; word lines 240 and refresh word lines 241 interconnect the memory cells in a second direction. Typically, the first and second directions are orthogonal (e.g., 90°). Providing bit lines and refresh bit lines that intersect word lines and refresh word lines at an angle other than 90° is also useful. The access port of a memory cell is coupled to the bit line and word line while the refresh port is coupled to the refresh bit line and refresh word line.

Row decoders 250a–b are provided for the sub-arrays. Typically, a row decoder includes decoding logic and word line drivers coupled to the word lines of the sub-array. The decoding logic receives a row address (RA); decodes it, and activates the word line driver coupled to the word line corresponding to the decoded address. The word line driver drives the word line to an active voltage (e.g., active high voltage such as $V_{DD}$). As shown, a row decoder is provided for each sub-array within the memory bank. Sharing of row decoders between sub-arrays of different banks or within the same bank is also useful.

The bit lines of the sub-arrays are coupled to a sense amplifier bank 260 having a plurality of sense amplifiers. A sense amplifier is coupled to a pair of bit lines for sensing and amplifying a differential signal created by a selected memory cell within the bit line pair. The differential signal represents the bit of data stored in the selected memory cell. In one embodiment, the bit lines coupled to a sense amplifier are not from the same sub-array, forming an open bit line architecture. Other bit line architectures, such as folded bit line (i.e., the bit lines coupled to a sense amplifier are from the same sub-array) or open-folded, are also useful.

The sense amplifier bank may also include, for example, column decoder, pre-charge amplifiers, and write circuitry to facilitate memory accesses. Interface circuitry 290 is coupled to the sense amplifier bank for transferring data read from the selected cells to a data bus (DO or DI to internal memory bus).

A control circuit 280 receives the input signals to the memory block (e.g., SEL, CLK, R/W) and generates internal control signals to perform the memory access. The input and internal control signals are discussed in greater detail in conjunction with FIGS. 4–6.

The refresh word lines are coupled to a refresh decoder. The refresh row decoder can be, for example, a part of the row decoder. Providing a separate refresh decoder is also useful. The refresh decoder includes decoding logic which selects a refresh word line based on a refresh row address (RRA).

Refresh amplifier banks 270a–b are also provided for sub-arrays 220a–b. The refresh amplifier banks include a plurality of refresh amplifiers coupled to refresh bit lines of respective memory sub-arrays 220a–b. The refresh amplifier banks receive an input signal, such as a refresh enable signal (RE), from the refresh control circuit 275. An active RE signal activates the refresh amplifiers, refreshing the selected row of memory cells of the sub-arrays after the refresh word line has been enabled.

In one embodiment, a refresh control circuit 275 is provided to generate the signals to perform refreshing the memory cells. The refresh control circuit includes, for example, a detection circuit that detects the charge level stored in a dummy cell. When the charge dissipates below a predefined level, a signal is generated to indicate the start of a refresh cycle. Other techniques for determining the start of a refresh cycle, such as the use of a counter, are also useful. The start refresh signal can be used to derive control signals used to perform the refresh operation (e.g., RRA, refresh word line enable, and active RE). The memory cells of a sub-array are typically refreshed one row at a time. The rows can be refreshed sequentially (one right after the other) or distributed within the refresh cycle.

Figure 3:
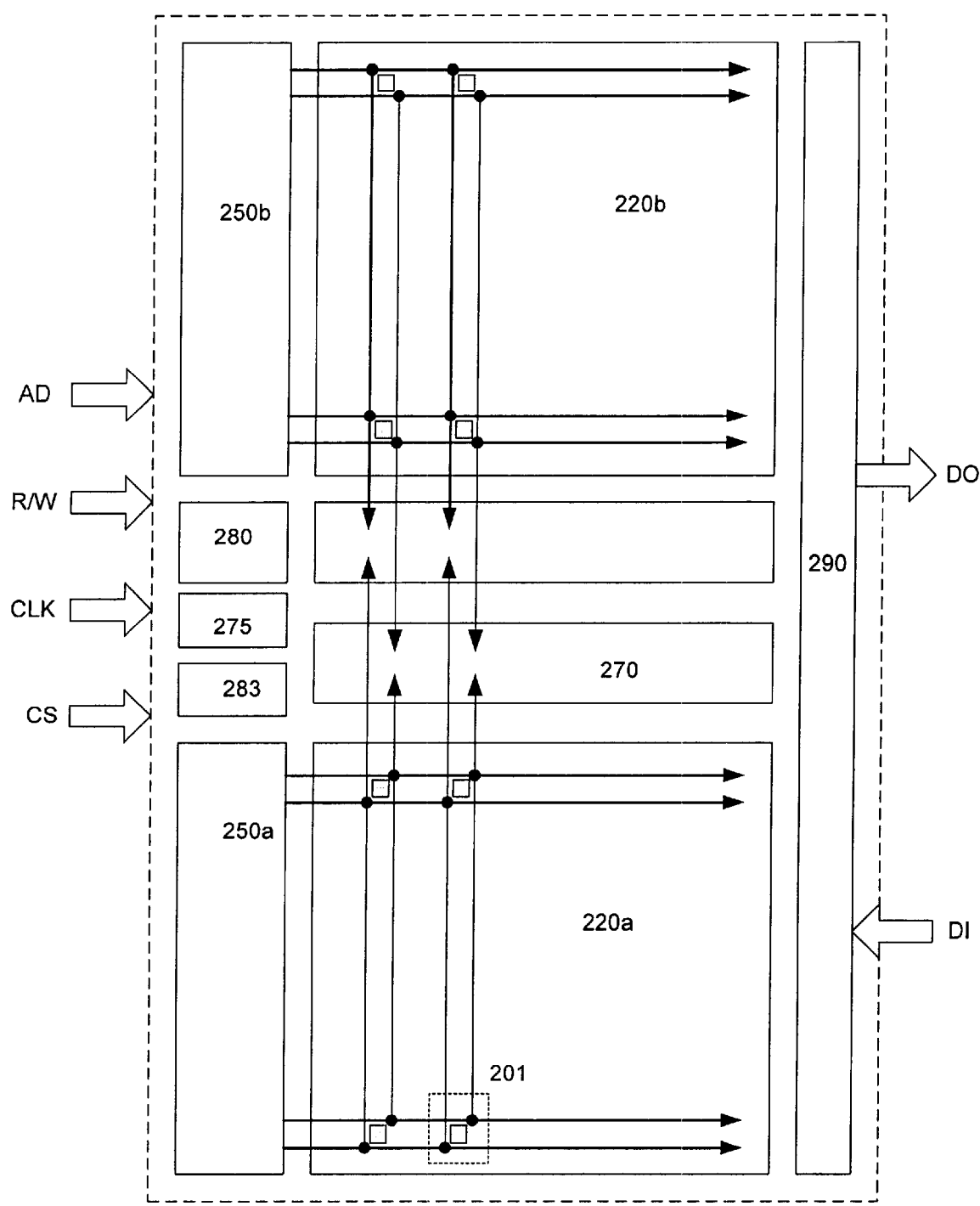

As shown, a refresh amplifier bank is associated with a sub-array. The refresh amplifiers, for example, are located adjacent to the respective sub-array on a side opposite the side where the refresh amplifier bank is located. Alternatively, as shown in FIG. 3, providing a refresh amplifier bank 270 that is shared between the sub-arrays and/or in other regions of the array can also be useful. The refresh amplifier bank is located adjacent to the sense amplifier bank and is coupled to refresh bit lines from the sub-arrays 220a–b.

Figure 4:
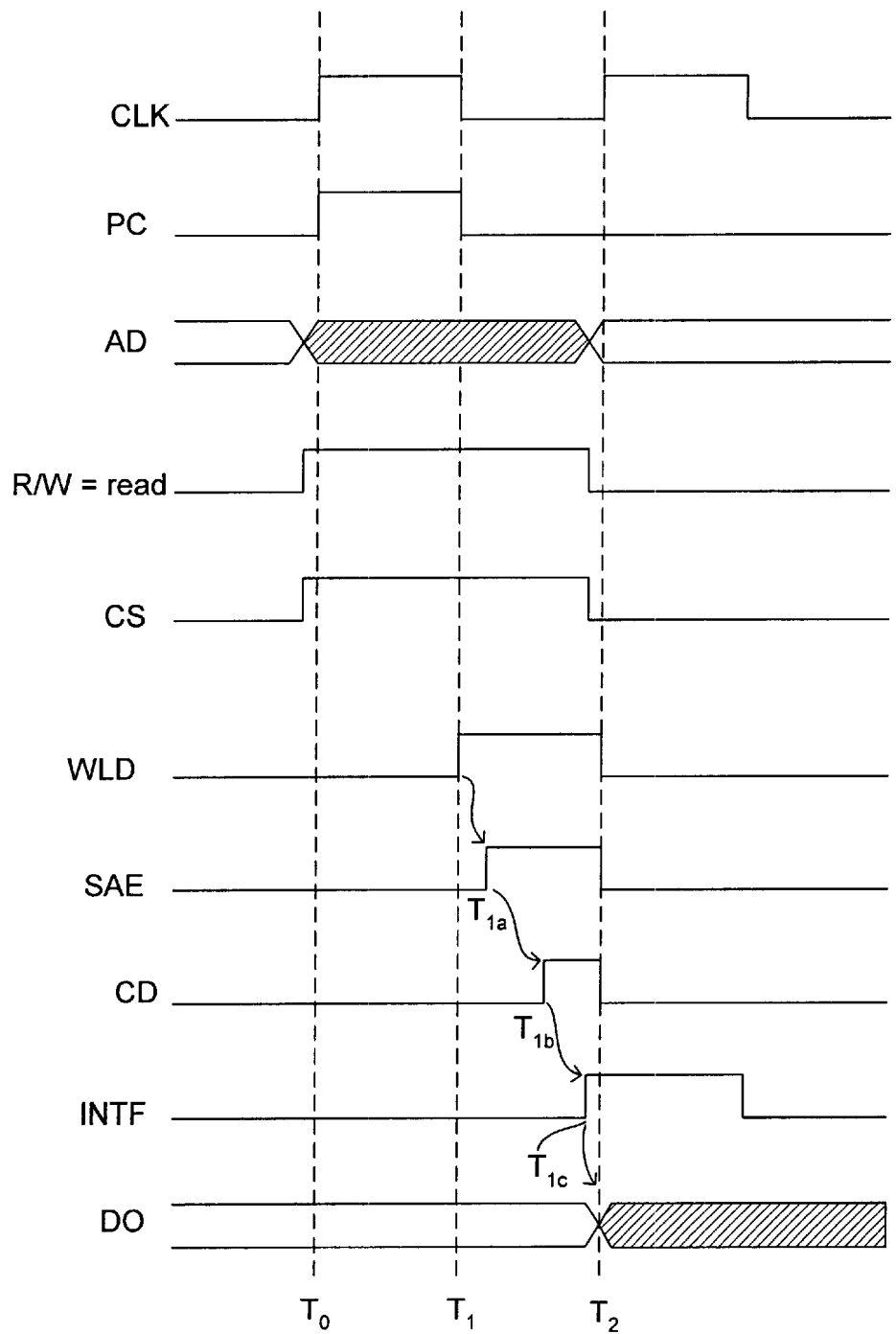
FIG. 4 shows a timing diagram of a read memory access.
Figure 5:
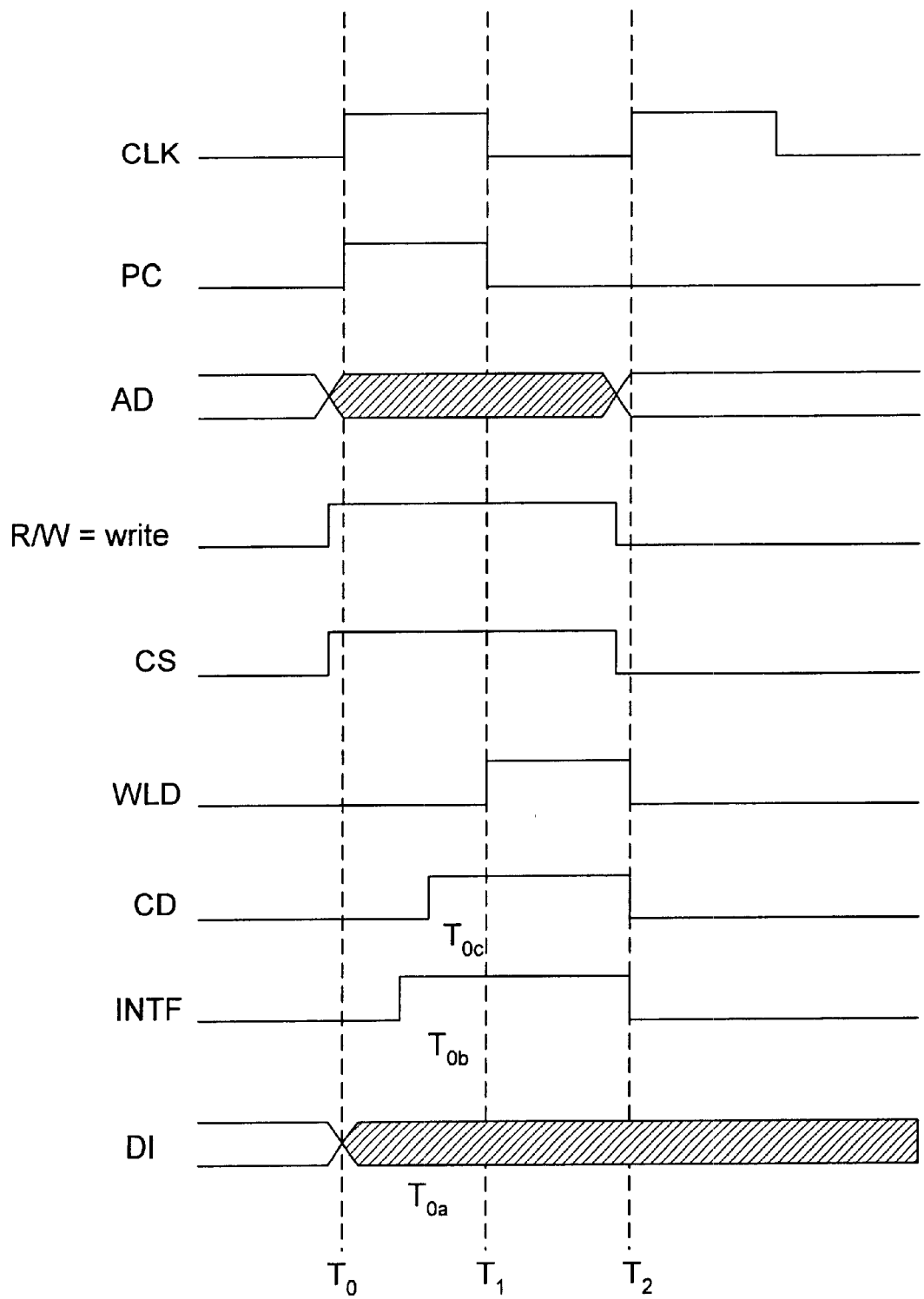
FIG. 5 shows a timing diagram of a write memory access.
Figure 6:
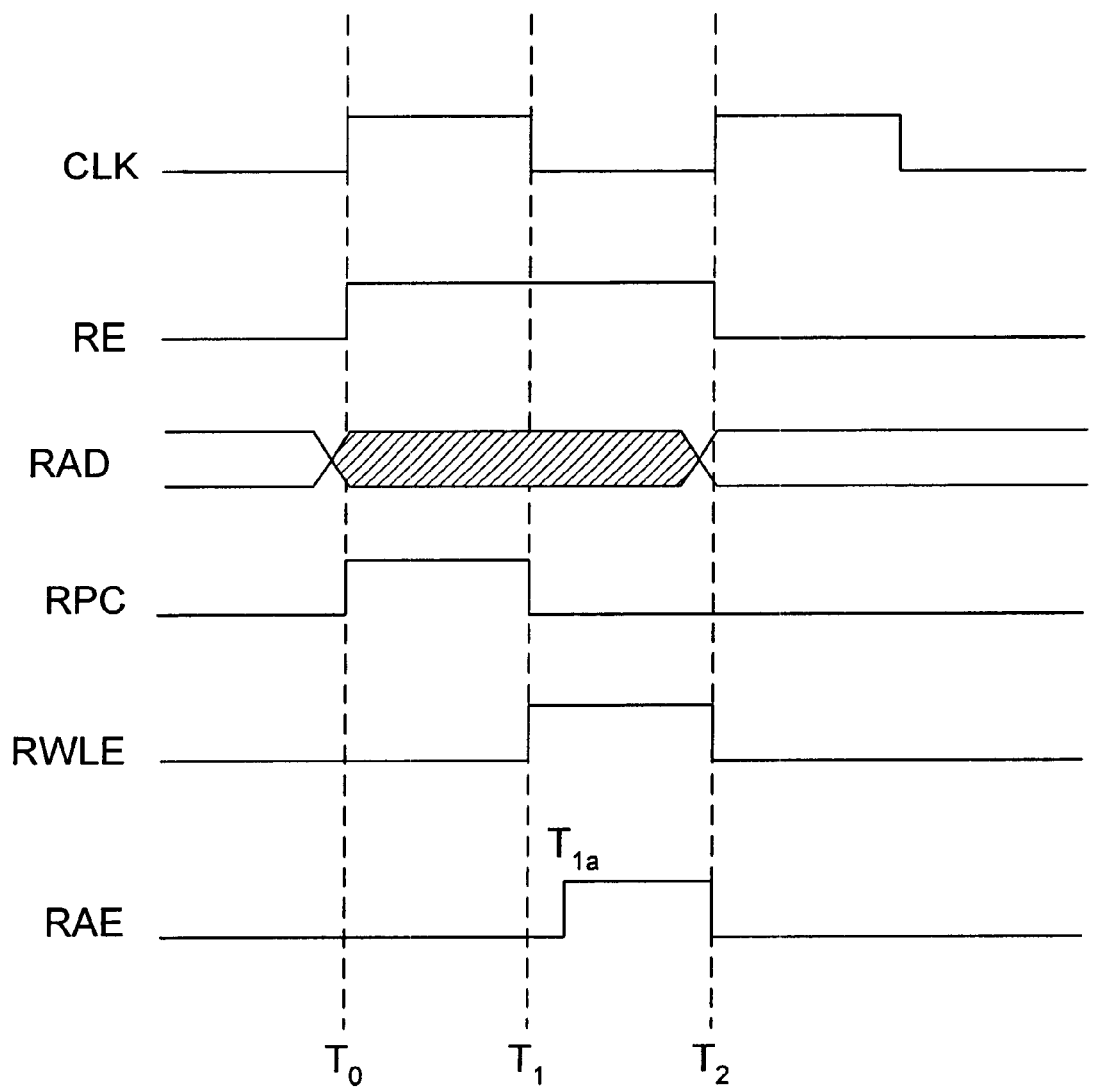
FIG. 6 shows a timing diagram of a refresh cycle.

FIGS. 4–6 show timing diagrams of memory operations. Referring to FIG. 4, a timing diagram of a read cycle in accordance with one embodiment of the invention is shown. A CLK signal provides a periodic wave to the memory block. The duration of the read cycle is about 1 period of the CLK signal (from about the rising edge of the CLK at $T_0$ to the next rising edge at $T_2$). At a time slightly before $T_0$, active CS and R/W (indicating a read) signals are provided to the memory block to initiate a read. The CS and R/W signals remain activated until a time slightly before $T_2$. The CLK and R/W input signals, for example, are provided to the control circuit of the memory block to generate control signals.

An AD corresponding to the memory location from which data is to be read is provided at about $t_0$. The address remains valid until the end of the read cycle at about $t_2$. The address includes row and column portions. The row and column portions of the address are provided to the row and column decoder for decoding. A bank portion of the address (e.g., for blocks with more than 1 bank) is provided to the control circuit to select the appropriate memory bank for accessing.

The R/W signal causes the control block to generate an active precharge (PC) signal from $t_0$ to $t_1$, precharging the bit lines to a predefined reference voltage level. After the bit lines are precharged, the control circuit generates an active word line decode (WLD) signal at $t_1$. The active word line decode signal activates the word line driver associated with the decoded row address to select the word line coupled thereto.

At $T_{1a}$, an active column decode (CD) signal is generated by the control circuit, causing the column decoder to coupled the bit lines corresponding to the decoded address to the sense amplifiers. The charge stored in the selected memory cells causes a differential voltage on respective bit line pairs. An active sense amplifier enable (SAE) signal is generated after the differential voltage becomes valid on the bit line pair at $T_{1b}$, activating the sense amplifiers to sense and amplify the differential signals on the selected bit line pairs. Generating the column decode signal at $T_{1a}$ and the active sense amplifier enable signal at $T_{1b}$ is also useful. The interface circuit latches the data from the sense amplifiers and drives it onto the DO bus as a result of an active interface (INTF) signal at $T_{1c}$.

Referring to FIG. 5, a timing diagram of a write cycle in accordance with one embodiment of the invention is shown. Like the read cycle, active CS and R/W (indicating a write) signals are provided slightly before the rising edge at $t_0$ until just before $T_2$ to initiate a write operation in the memory block. The row and column portions of AD are provided to the row and column decoders for decoding. A bank portion can be provided to the control circuit.

The CS signal causes the control block to generate an active PC signal from $T_0$ to $T_1$, precharging the bit lines. At $T_{0a}$, the write data on DI is provided to the memory block. An active INTF signal at $t_{0b}$ causes the interface circuit to latch DI and drive the data onto the write data path. An active CD signal at $T_{0c}$ couples the sense amplifiers to the appropriate bit line pairs. Depending on the write data (0 or 1), the respective bit lines are charged to the appropriate voltage level. At T1, an active WLD signal is generated to write the data into the selected cells.

FIG. 6 shows a timing diagram of a refresh cycle in accordance with one embodiment of the invention. The clock signal is provided to the refresh control circuit. At $T_0$, an active RE signal is generated to initiate a refresh. Also, a RRA is provided to the refresh row decoder for decoding. An active refresh precharge (RPC) signal is also generated at To $T_0$ precharge the refresh bit lines. At $T_1$, after the bit lines are precharged, a refresh word line enable (RWLE) signal is generated to select the refresh word line corresponding to the decoded refresh address. A refresh amplifier enable signal is generated at $T_{1a}$ to activate the refresh amplifiers, thus refreshing the cells of the selected refresh word line. The refresh cycle is completed at $T_2$.

Figure 7:
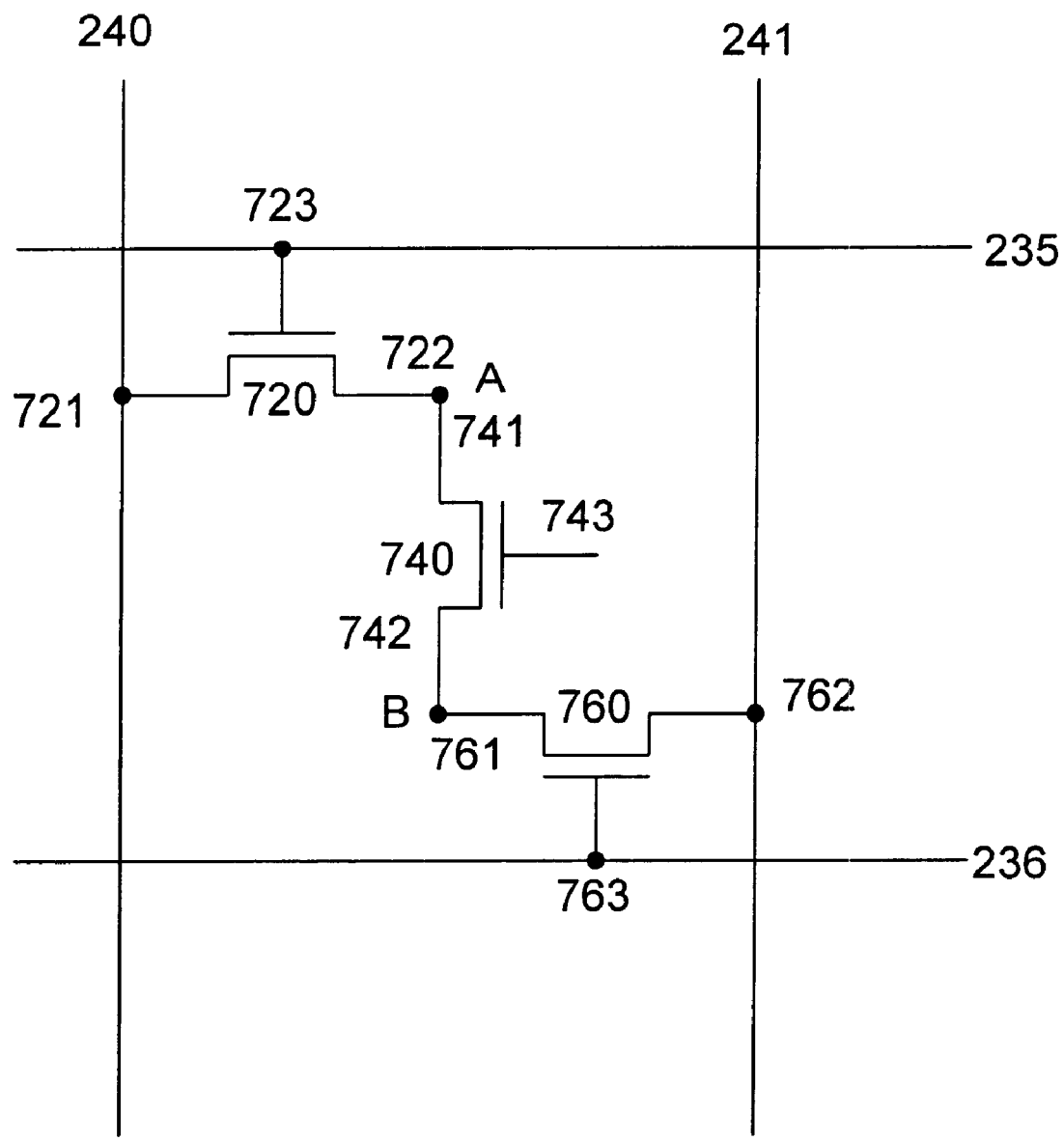
FIG. 7 shows a memory cell in accordance with one embodiment of the invention.

FIG. 7 shows a memory cell 701 in accordance with one embodiment of the invention. Such memory cell, for example, is described in copending patent application, titled: "Single-Port Memory Cell", U.S. Ser. No. 09/806,395, which is herein incorporated by reference for all purposes. The memory cell comprises first and second access transistors 720 and 760 coupled on series to a storage transistor 740. The transistors, in one embodiment, are n-FETs. The use of p-FETs or a combination of n and p-FETs is also useful. The first access transistor serves as the memory access port and is coupled to a bit line 240 and a word line 235; the second access transistor serves as the refresh port and is coupled to a refresh bit line 236 and refresh word line 241. A gate 643 of the storage transistor is coupled to an active signal to render the transistor conductive. In one embodiment, an n-FET storage transistor has its gate coupled to $V_{DD}$. As such, when power is applied to the IC, the storage transistor is rendered conductive, coupling node A to node B. When power is removed from the IC, node A and node B are isolated from each other.

To perform a memory access, the word line is activated or selected (e.g., logic 1) to render the first access transistor conductive. As a result, node A is coupled to the bit line via terminal 621 of the first access transistor. The charge stored at node A is transferred to the bit line for a read access or the charge on the bit line is transferred to node A for a write. A refresh is performed by activating refresh word line to render the second access transistor conductive, coupling node B to the refresh bit line via terminal 662.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A memory architecture comprising:

an access transistor having a gate and first and second terminals;

a storage transistor having a gate and first and second terminals, the first terminal of the storage transistor coupled to the second terminal of the access transistor;

a refresh transistor having a gate and first and second terminals, the second terminal of the refresh transistor coupled to the second terminal of the storage transistor;

a word line coupled to the gate of the access transistor;

a refresh word line coupled to the gate of the refresh transistor;

a bit line coupled to the first terminal of the access transistor;

a refresh bit line coupled to first terminals of refresh transistor;

a sense amplifier coupled to the bit line; and a refresh amplifier coupled to the refresh bit line.

* * * * *